United States Patent
Chen et al.

[11] Patent Number: 5,567,660
[45] Date of Patent: Oct. 22, 1996

[54] SPIN-ON-GLASS PLANARIZATION BY A NEW STAGNANT COATING METHOD

[75] Inventors: Shih-Shiung Chen; Kern-Shen Chou, both of Hsiu-Chu, Taiwan

[73] Assignee: Taiwan Semiconductor Manufacturing Company Ltd, Hsin-Chu, Taiwan

[21] Appl. No.: 527,707

[22] Filed: Sep. 13, 1995

[51] Int. Cl.⁶ ................................... H01L 21/473
[52] U.S. Cl. ............................................ 437/231
[58] Field of Search ...................................... 437/231

[56] References Cited

U.S. PATENT DOCUMENTS

| | | | |
|---|---|---|---|
| 4,822,639 | 4/1989 | Fujii et al. | 427/240 |
| 5,094,884 | 3/1992 | Hillman et al. | 427/240 |
| 5,238,878 | 8/1993 | Shinohara | 437/231 |
| 5,254,497 | 10/1993 | Liu | 437/173 |
| 5,328,871 | 7/1994 | Tanigawa et al. | 437/231 |
| 5,371,046 | 12/1994 | Liaw et al. | 437/231 |
| 5,382,547 | 1/1995 | Sultan et al. | 437/231 |
| 5,395,803 | 3/1995 | Adams | 437/229 |
| 5,405,813 | 4/1995 | Rodrigues | 437/231 |
| 5,429,990 | 7/1995 | Liu et al. | 437/190 |
| 5,453,406 | 9/1995 | Cheu | 437/231 |
| 5,461,010 | 10/1995 | Cheu et al. | 437/228 |

FOREIGN PATENT DOCUMENTS

| | | | |
|---|---|---|---|
| 55-117235 | 9/1980 | Japan | H01L 21/225 |
| 61-140135 | 12/1984 | Japan | H01L 21/30 |
| 61-136617 | 11/1986 | Japan | H01L 21/94 |
| 64-295523 | 11/1989 | Japan | H01L 21/027 |
| 5243140 | 9/1993 | Japan | H01L 21/027 |
| 5259049 | 10/1993 | Japan | H01L 21/027 |

*Primary Examiner*—Robert Kunemund
*Assistant Examiner*—Matthew Whipple
*Attorney, Agent, or Firm*—George O. Saile; William J. Stoffel

[57] ABSTRACT

An improved process to form a planar spin-on-glass layer on a semiconductor body. The process comprises forming a first dielectric layer over a conductive layer. Next, a spin-on-glass (SOG) layer is formed on the first dielectric layer. The SOG layer can be formed of a silicate or a siloxane, each having different process parameters. The SOG solute is dispensed on a stationary wafer. Then two spin cycles are applied to the wafer: a first low speed cycle is applied while the solute is being dispensed on to the wafer and a second high speed cycle. The stationary SOG dispensing and the first low speed cycle allow the solute to more readily fill in tight valleys between metal line. Moreover, the speed and timing of the low speed spin/dispensing allow the proper amount of solvent to evaporate thus increasing the SOG viscosity which improves the planarization for a given thickness of SOG. This process significantly increases the ability of the SOG to fill between closely spaced lines and form a smooth planar layer.

22 Claims, 1 Drawing Sheet

SPIN-ON-GLASS PLANARIZATION BY A NEW STAGNANT COATING METHOD

BACKGROUND OF INVENTION

1) Field of the Invention

This invention relates to a manufacturing process for a semiconductor device, and more particularly to a process for forming a planar spin-on-glass layer.

2) Description of the Prior Art

As the scale of integration increases and device dimensions decrease, the performance of VLSI chips is limited by interconnection capabilities. For example, VLSI technology for 1-micrometer processes requires a greater control on the materials and techniques that are well beyond that of only slightly larger 2-micrometer processes. While the dimension is scaled in half, the degree of difficulty can increase in the range of 5 to 10 times. Furthermore, as the number of layers of interconnection increases, even more stringent requirements are placed on the interlayer dielectric separating the metal layers.

Multi-layer metallization is required to provide improved interconnection capabilities for increased circuit speed, circuit density, as well as design flexibility for customized applications. However, the surface topography generated by multi-layer processes causes serious difficulties for subsequent processing steps such as lithography, deposition and etching. It also degrades device reliability by causing poor step coverage, metal migration, and induced cracking. Therefore, surface planarization is essential for continual progress in integration.

Historically, the interlayer dielectric has been a chemical vapor deposition (CVD) oxide that has produced a less than conformal coating. With decreased metal spacing, this deposition method produces undesirable voids between the tight metal lines. The severe topography induced by multi-layer interconnects and conformal coatings increases the difficulties in metal deposition. However, many different approaches have been studied and used to give a more planar dielectric layer, such as glass flow and reflow, bias sputter quartz, lift-off, etch-back processes and spin-on-dielectric.

Among the several dielectric planarization schemes available, spin-on glass (SOG) offers the greater potential and flexibility as a planarizing medium for the inter metal dielectric. SOG is a smoothing dielectric applied by spin coating that fills the spaces in the smaller geometry. The general composition of SOG materials range from silicates (Si—O) framework to polysiloxanes which contain varying concentrations of methyl and phenyl groups.

Silicate materials, either undoped or doped, generally solidify to a rigid film at a rather low temperature and crack easily for thicker coatings, particularly over surface topography. The polysiloxane materials, with various attach organic groups, were developed to improve the coating characteristics as well as to prevent crack formation for thicker coatings. However, silicate and siloxane films can not be formed thick enough to adequately planarize (smooth) the substrate surface because voids from the SOG layer form and the thick SOG layers crack. Because of these shortcomings, thinner SOG layers were tried, but the thin layers also have drawbacks.

When thin layers of SOG, in the range of 1000 Å and thicker, are used, a CVD dielectric is needed to form the isolation between the metal layers. As a result of several problems, such as adhesion loss and degradation of film stability, a sandwich scheme with a layer of SOG encapsulated between two layers of CVD dielectric is effective in obtaining planarization without the problems exhibited by a single layer of CVD and a single layer of SOG. A first dielectric layer is the bottom layer and serves as an adhesion and hillock suppresser layer and should prevent the SOG from coming in contact with the metal. SOG is the middle layer and serves primarily as the planarization layer. Finally a second CVD dielectric is the third layer and serves as an isolation layer.

Theoretically, the SOG layer should transform the severe topography of the device into a smooth one thus allowing the third layer to have a good step coverage and good isolation. However, the SOG materials generally used have problems associated with them. The thickness at which the SOG materials crack is largely dependent on the chemical composition.

As a result of the a thick film's tendency to crack, the planarity of a single thin SOG spin application is generally not adequate, therefore at normally two or more coats applied in sequence are necessary to obtain satisfactory planarity.

A major problem with SOG planarization layers is that the SOG layers do not readily fill in between closely spaced lines and the resulting surface is not smooth. This less than planar SOG surface can cause problems and voids in subsequent layers. For example, voids can form in overlying metal layers. Metal lines are formed over field oxide regions in the substrate. Next, a dielectric layer is formed over the SOG and metal lines. Then a via is formed through the dielectric and SOG layers over the metal lines. A metal layer is formed over the dielectric layer and SOG layer over the metal lines. Sometimes where the SOG layer is not planar between the metal lines, the overlying metal layer has voids. Voids in the metal layer cause circuit failure and reliability problems.

In addition, non-planar SOG layers can cause poison via problems. In the via, the SOG layer is in direct contact with the metal layer. Especially when excess water is present in the SOG, the SOG corrodes the metal layer causing metal contact problems called poison via problems.

Another disadvantage with the current spin-on-glass process is that the SOG layer must be very thick to provide a smooth planar surface over the rough substrate topographies. These thick SOG layers are a disadvantage because they make the electrical circuits larger and therefore slower. Moreover, thick SOG layers are not as structurally strong as thin layers. Furthermore, thick SOG layers are more prone to the void problems described above.

Thick SOG layers also make the via poison problems worse. Interconnections are required between the upper and lower conductive lines, requiring the use of contacts or vias. In the vias, the SOG is in direct contact with the metal interconnects. If excess water is present in the SOG, problems such as via poisoning can occur. The thicker the SOG layer, the greater the chance of poison via problems because of the greater amount of moisture in the thick SOG layer and the greater metal surface area.

There is a need for a SOG process which simultaneously can: (1) provide improved planarity with thinner SOG layers, (2) can be formed between closely spaced structure without forming voids in overlying layers, and (3) can reduce the poison via problem.

SUMMARY OF THE INVENTION

It is an object of the present invention to provide an improved spin-on-glass process which can be formed between closely spaced structures without forming voids in overlying metallurgy layers.

It is another object of the present invention to provide an improved spin-on-glass process which will provide a smoother and more planar surface for a given SOG layer thickness.

It is yet another object of the present invention to provide an improved spin-on-glass process which can provide thinner SOG layers which prevent the poison via problem.

In accordance with these objective an improved process to form a planar spin-on-glass layer on a semiconductor body is provided. A semiconductor body with devices formed within and on its surface and with at least one patterned conductive layer formed thereover is provided. The conductive layer has valleys in-between patterned sections of a first conductive layer. Next, a first dielectric layer is formed over the conductive layer. The improved spin-on-glass (SOG) layer is formed on the first dielectric layer as follows. A SOG solution containing a solute for forming the SOG layer is dispensed on the body while the body is stationary. The body is then spun in a first low speed spin/dispense cycle while the SOG solution is dispensed on the body. Then, the body is spun in a second spin cycle without dispensing the SOG solution. After that, the body is baked. Normally, this (1) dispense, (2) low speed spin/dispense, (3) high speed spin, and (4) bake process is repeated at least one more time to form the proper thickness of SOG. Lastly, a second dielectric layer is formed over the SOG layer.

The process of the invention can be used with any kind of SOG solute, and preferably siloxane and silicate solutes. The stationary dispensing, first spin cycle/dispense and second spin cycle have set points depending on the type of solute used and the thickness of the SOG layer. These set points are describe further below.

This invention significantly reduces formation of voids in overlying metal layers while increasing the planarization for a given SOG thickness. The stationary SOG dispensing and the first low speed cycle allow the solute to more readily fill in tight valleys between metal lines thus preventing void formations in the SOG layer. Also, combination of the timing and the spin speeds allow the correct amount of solvent to evaporate thus increasing the SOG viscosity which improves the planarization for a given thickness of SOG. Because thinner SOG layers can be used and the coating sequence allows the solute to more readily fill in between metal lines, no SOG will reside on top of the metal line near the via. Since no SOG is present near the via, the poison via problem is also reduced.

DETAILED DESCRIPTION OF THE PREFERRED EMBODIMENTS

Figure 1:
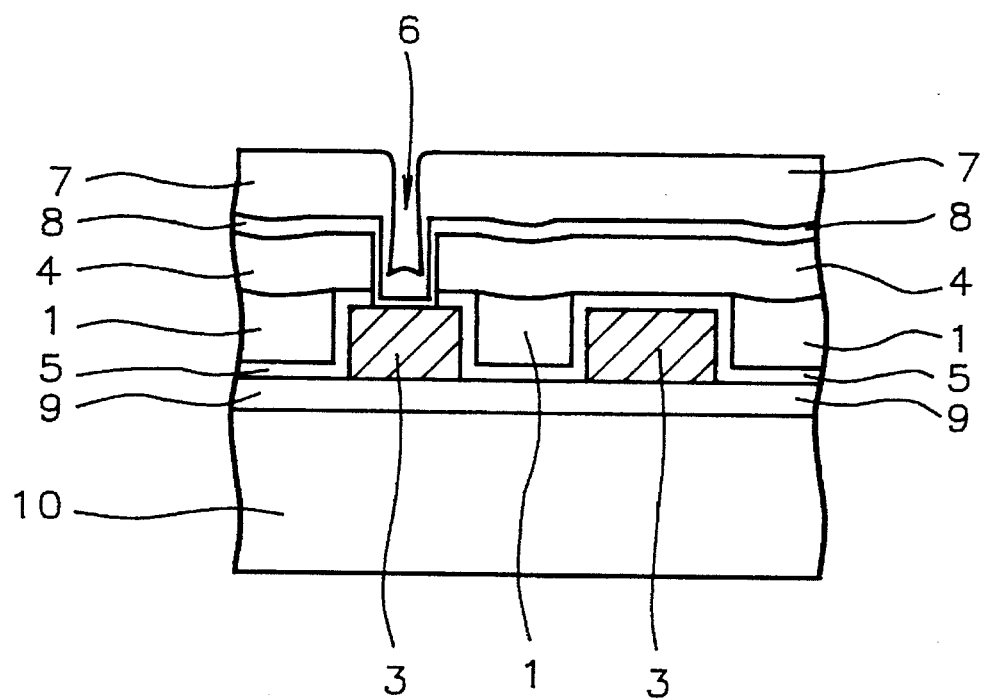
FIG. 1 shows a vertical cross-sectional drawing a semiconductor circuit that shows the results of spin-on-glass process of the present invention.

The present invention will be described in detail with reference to the accompanying drawings. It should be noted that the drawings are in greatly simplified form. In practice the semiconductor device structure will be one of many supported on a common substrate connected with suitable metallurgy in various electronic electric circuit configurations. The substrate 10 shall be a monocrystalline silicon semiconductor body with many devices fabricated therein and thereon, as is well known in the art. The substrate 10 is preferably formed of monocrystalline silicon preferably having a crystalline orientation of <1 0 0>. The semiconductor body 10 can have devices formed within and on its surface and with at least one patterned conductive layer thereover. The conductive layers is formed so that valleys are between patterned sections 3 of the first conductive layer.

FIG. 1 shows a planarized multi-layer metallization structure with closely spaced conductive lines 3. An insulating layer 9 is formed over the substrate 10 surface. A conductor layer is deposited and patterned by lithography and etching thus forming metallurgy lines 3.

The dielectric spin-on-glass sandwich structure 5, 1, 4 is composed of: (1) a dielectric layer 5, (2) spin-on-glass (SOG) layer 1 and (3) a second dielectric layer 4. Using SOG process of the current invention, the SOG layer 1 adequately fills in between the metal lines 3 and forms a planar surface. Also, no SOG layer remains over the conductive line 3 in the via 6 area. A via 6 is cut through the sandwich structure 4 1 5 over the metallurgy lines 3. A barrier layer 8 is formed over the surface. Next, a metal layer 7 is formed over the barrier layer 8. Because the SOG layer is planar between the metallurgy lines 3, the metal layer 7 does not have voids. After these additional insulating layers and metallurgy layer are formed over the structure (not shown).

The process to form the spin-on-glass (SOG) sandwich begins by depositing a first dielectric layer over the patterned conductor layer 3 as shown in FIG. 1. The first dielectric layer 5 can be formed by any process such as, atmospheric pressure chemical vapor deposition. The dielectric layer 5 is preferably formed by a plasma enhanced chemical vapor deposition process (PECVD) process. The dielectric layer 5 can have a thickness in the range of about 1500 to 3000 Å and more preferably a thickness of about 2000 Å. The thickness of the dielectric layer 5 must be carefully controlled so that a thick layer does not form voids between the metal lines.

The second layer 1 of the sandwich is the spin-on-glass composite of spin-on-glass coatings. Its function is to serve as the planarization layer of the sandwich. It is usually necessary to use two or more coating of spin-on-glass to provide the best possible planarization. After the curing of this layer, the resulting layer is similar to silicon dioxide. This layer may be doped with N or P type dopants to relieve stress.

The improved spin-on-glass (SOG) layer is formed on the first dielectric layer as follows. A SOG solution containing a solute for forming the SOG layer is dispensed on the body while the body is stationary. The body is then spun in a first low speed spin cycle while the SOG solution is dispensed on the body. This low speed spin/dispense step is critical as this step increases the SOG viscosity and increases the amount of solvent evaporation. This improves the planarization and reduces the poison via problem.

Then, the body is spun in a second spin cycle without dispensing the SOG solution. After that, the body is baked. Normally, this (1) dispense, (2) low speed spin/dispense, (3) high speed spin, and (4) bake process is repeated at least one more time to form the proper thickness of SOG. Lastly, a second dielectric layer is formed over the SOG layer.

The process of the invention can be applied with any kind of SOG solute, but preferably siloxane and silicate solutes. Examples of suitable siloxane SOG solutes are: Allied Signal's model 211, 214, 314, 111. Allied Signal Corp., 1090 South Milpitas Boulevard, Milpitas, Calif. 95035; and TOK's OCD type -7 WK80, TOK, 1-403 Kosugi-machi, Nakahara-Ku, Kawasaki, Kanagawa, 211 Japan. Examples of suitable silicate SOG solutes are: TOK, OCD-483 16-SG. The stationary dispensing, first spin cycle, and second spin cycle have set points depending on the type of solute used and the thickness of the SOG layer. These set points are describe below in tables 1 and 2.

For a SOG solution composed of a silicate, the first spin cycle has a speed in the range of about 50 to 150 rpm and preferably a speed of about 100 rpm for a time in the range of about 1.5 to 2.5 seconds and preferably a time of about 1 second. The second spin cycle has a speed in the range about

TABLE 1

Preferred Process Parameters for SOG Solutions

| Step | Silicate SOG Material TOK OCD 48316 | Siloxane SOG Material Allied Signal 211 |
| --- | --- | --- |
| To achieve Target SOG Thickness | 2000 +/– 100 Å | 3200 +/– 100 Å |
| Stationary solution dispense step | Dispense at 0 rpm for 3 +/– 0.5 seconds | Dispense at 0 rpm for 1 +/– 0.5 seconds |
| Dispense/First spin cycle (dispense and Slow speed spin) *Critical step | spin at about 100 +/– 50 rpm for about 2 +/– 0.5 seconds | spin at about 300 +/– 50 rpm spin for about 1 +/– 0.5 seconds |
| second spin cycle (high speed spin to adjust thickness of SOG) Baking parameters: | spin at about 3700 +/– 100 RPM for about 19 to 21 seconds | spin at about 6500 +/– 100 RPM for about 19 to 21 seconds |
| 1ST BAKE | about 80° C. for 60 sec | about 80° C. for 60 sec |
| 2ND BAKE | about 150° C. for 60 sec | about 150° C. for 60 sec |
| 3RD BAKE | about 220° C. for 60 sec *note the above steps are preferably repeated twice before the vacuum bake and cure. | about 220° C. for 60 sec *note the above steps are preferably repeated twice before the vacuum bake and cure. |
| Repeat the above Dispense/spin and bake steps a second time | | |
| Vacuum bake | about 250 C. and 3 mtorrs for 20 min by furnace | at about 250° C. and 3 mtorrs for 20 min by furnace |
| Furnace cure | Heat at about 415° C. for about 60 minutes with a N2 flow of about 14 liters/min | Heat at about 415° C. for about 60 minutes with a N2 flow of about 14 liters/min |

TABLE 2

Preferred Process Parameters

| Step | Siloxane SOG Material TOK Type 7 WK80 |
| --- | --- |
| To achieve Target SOG Thickness | 3200 +/– 100 Å |
| Stationary solution dispense step | Dispense at 0 rpm for 1 +/– 0.5 seconds |
| Dispense/First spin cycle (dispense and Slow speed spin) *Critical step | spin at about 300 +/– 50 rpm spin for about 2 +/– 0.5 seconds |
| second spin cyde (high speed spin to adjust thickness of SOG) Baking parameters: | spin at about 7500 +/– 100 RPM for about 19 to 21 seconds |
| 1ST BAKE | about 80° C. for 60 +/– 5 sec |
| 2ND BAKE | about 150° C. for 60 +/– 5 sec |
| 3RD BAKE | about 220° C. for 60 +/– 5 sec *note the above steps are preferably repeated twice before the vacuum bake and cure. |
| Repeat the above Dispense/spin and bake steps a second time | |
| Vacuum bake | at about 250° C. and 3 +/– 1 mtorrs for 20 min by furnace |
| Furnace cure | Heat at about 415° C. for about 60 minutes with a N2 flow of about 14 liters/min | of 3600 to 3800 and a speed of about 3700 RPM for a time in the range of about 19 to 21 seconds.

For a SOG solution composed of a siloxane, the first spin cycle has a speed in the range of about 250 to 350 rpm and preferably a speed of about 300 rpms for a time of in the range of about 0.5 to 2.5 seconds. The second spin cycle has a speed in the range of about 6400 to 7600 rpm for a time in the range of about 0.5 to 2.5 seconds. The second spin cycle is performed for a time measured to achieve the proper thickness of SOG and is preferably performed for about 19 to 21 seconds.

Next, the SOG layer is baked in a three step bake followed by a vacuum bake and furnace cure. The three step bake can be performed on a hot plate. The first step includes baking the body at a temperature in the range of about 78° to 82° C. and preferably at temperature of about 80° C. for a time in the range of about 59 to 61 seconds and a time of preferably about 60 seconds, and in a gas ambient of nitrogen gas. The second step includes baking the body at a temperature in the range of about 148° to 152° C. and preferably at temperature of about 150° C. and at a time of about 60 seconds and for a time in the range of about 59 to 61 seconds in a gas ambient of $N_2$ gas. The third step includes baking the body at a temperature in the range of about 218° to 222° C. and preferably at temperature of about 220° C. for a time in the range of about 59 to 61 seconds and a time of about 60 seconds, and in a gas ambient of $N_2$ gas.

Next, the SOG apply, spin and bake process is repeated until the desired thickness of SOG layer is formed. Preferably, the SOG apply and spin process is performed twice. The spin-on glass layer comprises a composite layer of thickness t consisting of n contiguous thin layers, each having a thickness of approximately t/n. For a silicate SOG material, performing the above coat/spin/bake process (dispense/spin/bake steps performed two times) should yield a SOG thickness in the range of 1900 to 2100 Å. For a siloxane SOG material, performing the above coat/spin/bake process (dispense/spin/bake steps performed two times) should yield a SOG thickness in the range of 3100 to 3300 Å.

Next, the body is vacuum baked which includes baking the body at a temperature in the range of about 240° to 260° C. and at temperature of about 250° C. for a time in the range of about 18 to 22 minutes and preferably about 20 minutes, and at a pressure between about 2 to 4 mTorr and more preferably about 3 mTorr.

The body is then furnace cured which includes baking the body at a temperature in the range of about 410° to 420° C. and more preferably at temperature of about 415° C. and for a time in the range of about 55 to 65 minutes and more preferably for a time of about 60 minutes, and in a gas ambient of $N_2$ and at a $N_2$ flow rate of between about 13 to 15 liters/min and more preferably about 14 liters/min.

Next, the second dielectric layer 4 is formed over the spin-on-glass layer 1 as shown in FIG. 1. The second dielectric layer 4 serves as an isolation layer since it isolates the spin-on-glass layer from the next conductive layer level. The second dielectric layer 4 is preferably formed of silicon oxide formed by a PECVD process. The second dielectric layer has a thickness in the range of about 4000 to 5000 Å.

A via 6 is cut through the sandwich structure 4 1 5 over the metallurgy lines 3. A barrier layer 8 is formed over the surface. The barrier layer can be formed of TiN. Next, a metal layer 7 is formed over the barrier layer 8. Because the SOG layer 4 is planar between the metallurgy lines 3, the metal layer 7 does not have voids.

The invention significantly improves the SOG planarization process and in particular the ability of the SOG to fill between closely spaced metallurgy lines and form a planar resulting surface. The process of the invention reduces formation of voids in overlying layers while increasing the planarization for a given SOG thickness. The stationary dispensing and the critical first low speed spin cycle/dispense step allows the SOG layer to seep down into the small valleys between semiconductor structures thus improving planarization. Also, combination of the timing and the spin speeds allow the correct amount of solvent to evaporate thus increasing the SOG viscosity which improves the planarization for a given thickness of SOG. Furthermore, the high viscosity SOG layer which fills small valleys allows the use of thinner SOG layers which reduces the poison via problems and void formations.

This invention provides a simple and low cost method to improve gap filling capabilities of SOG with a slow speed spin/dispense step. This low speed spin/dispense step increases the viscosity of the SOG on a wafer during the spinning and as a result improves the gap filling property and planarity.

While the invention has been particularly shown and described with reference to the preferred embodiments thereof, it will be understood by those skilled in the art that various changes in form and details may be made without departing from the spirit and scope of the invention. For example, while the detailed example of the integrated circuit used a MOSFET integrated circuit, it is obvious to those skilled in the are that the planarization techniques of the invention will also be applicable to bipolar, BICMOS and other types of integrated circuit devices useful in the submicron processing field. Also, the incorporation of more than one polysilicon layer before the use of a first metal layer is clearly useful. In this alternative, a spin-on-glass layer is useful for planarization before the metal layer is formed.

What is claimed is:

1. A method for an improved planar spin-on-glass layer on a semiconductor body comprising:

providing a semiconductor body having devices formed within an on its surface and with at least one patterned conductive layer thereover; and patterned conductive layer comprised of closely spaced members having spaces there between;

depositing a spin-on-glass (SOG) layer at least filling said spaces between said spaced members; said SOG layer not having voids, by:
  (a) dispensing a solution containing a solute for forming said SOG layer on said body while said body is stationary;
  (b) dispensing said solution on to said body while applying first spin cycle to said body; said first cycle having a speed in the range of about 50 to 350 rpm;
  (c) applying a second spin cycle to said body; said second spin cycle having a speed greater than 3600 rpm; and
  (d) baking said body.

2. The method of claim 1 wherein said step (b) is performed for a time in the range about of 0.5 to 2.5 seconds and said step (c) is performed for a time between 19 to 21 seconds.

3: The method of in claim 1 wherein said solution is composed of a silicate; and said first spin cycle has a speed in the range of about 50 to 150 rpm for a time in the range of about 1.5 to 2.5 seconds; and said second spin cycle has a speed in the range of about 3600 to 3800 RPM for a time in the range of about 19 to 21 seconds.

4. The method of in claim 1, wherein said solution is composed of a siloxane; and said first spin cycle has a speed in the range of about 250 to 350 rpm for a time in the range of about 0.5 to 2.5; seconds said second spin cycle has a speed in the range of about 6400 to 9600 RPM for a time in the range of about 19 to 21 seconds.

5. The method of claim 1 wherein said step (d) comprises:
  (a) a three step bake, the first step includes baking said body at temperature in the range of about 78° to 82° C. for a time in the range of about 59 to 61 seconds in a gas ambient of nitrogen gas, the second step includes baking said body at temperature range of about 148° to 152° C. for a time in the range of about 59 to 61 seconds in a gas ambient of nitrogen gas, and the third step includes baking said body at temperature range of about 218° to 222° C. for a time in the range of about 59 to 61 seconds in a gas ambient of nitrogen gas with a nitrogen flow rate in the range between about 13 to 15 liters/min; and
  (b) vacuum baking said body in an atmospheric pressure in a furnace which includes baking said body at temperature range of about 240° to 260° C. for a time in the range of about 18 to 22 minutes, and in a pressure between about 2 to 4 mTorr.
  (c) curing said body in an atmospheric pressure oven at a temperature in the range between about 410° to 420° C. for a time in the range between 55 and 65 minutes with a nitrogen flow rate in the range of 13 to 15 liters/min.

6. The method of claim 1 which further includes repeating steps (a) through (d) at least one more time to form the proper thickness of said spin-on-glass layer.

7. The method of claim 1 which further includes forming a first dielectric layer over said patterned conductive layer and forming said SOG layer over said first dielectric layer.

8. The method of claim 1 which further includes forming a second dielectric layer over said SOG layer.

9. A method for forming a planar spin-on-glass layer on a semiconductor body in between closely spaced raised conductive members, comprising:

providing a semiconductor body having devices formed within and on its surface and with at least one raised patterned conductive layer thereover, said patterned conductive layer comprised of closely spaced raised conductive members having spaces therebetween; a space between said members of sad patterned conductive layer;

deposing a spin-on-glass (SOG) layer over said conductive layer and filling said spaced between said members of said conductive layer, but not convering said members, by:

(a) dispensing a solution containing a solute for forming said SOG layer on said body while said body is stationary;

(b) dispensing said solution on to said body while applying said first spin cycle to said body; said first cycle having a speed in the range of about 50 to 350 rpm;

(c) applying a second spin cycle to said body; said second spin cycle having a speed greater than 3600 rpm; and (d) baking said body.

10. The method of claim 9 wherein said step (b) is performed for a time in the range about of 0.5 to 2.5 seconds and said step (c) is performed for a time between 19 to 21 seconds.

11. The method of in claim 9 wherein said solution is composed of a silicate; and said first spin cycle has a speed in the range of about 50 to 150 rpm for a time in the range of about 1.5 to 2.5 seconds; and said second spin cycle has a speed in the range of about 3600 to 3800 RPM for a time in the range of about 19 to 21 seconds.

12. The method of in claim 9, wherein said solution is composed of a siloxane; and said first spin cycle has a speed in the range of about 250 to 350 rpm for a time in the range of about 0.5 to 2.5 seconds; said second spin cycle has a speed in the range of about 6400 to 9600 RPM for a time in the range of about 19 to 21 seconds.

13. The method of claim 9 wherein said step (d) comprises:

(a) a three step bake: the first step includes baking said body at temperature in the range of about 78° to 82° C. for a time in the range of about 59 to 61 seconds in a gas ambient of nitrogen gas, the second step includes baking said body at temperature range of about 148° to 152° C. for a time in the range of about 59 to 61 seconds in a gas ambient of nitrogen gas, and the third step includes baking said body at temperature range of about 218° to 222° C. for a time in the range of about 59 to 61 seconds in a gas ambient of nitrogen gas with a nitrogen flow rate in the range between about 13 to 15 liters/min; and (b) vacuum baking said body in an atmospheric pressure in a furnace which includes baking said body at temperature range of about 240° to 260° C. for a time in the range of about 18 to 22 minutes, and in a pressure between about 2 to 4 mTorr.

(c) curing said body in an atmospheric pressure oven at a temperature in the range between about 410° to 420° C. for a time in the range between 55 and 65 minutes with a nitrogen flow rate in the range of 13 to 15 liters/min.

14. The method of claim 9 which further includes repeating steps (a) through (d) at least one more time to form the proper thickness of said spin-on-glass layer.

15. The method of claim 9 which further includes forming a first dielectric layer over said conductive layer and forming said SOG layer over said first dielectric layer.

16. The method of claim 9 which further includes forming a second dielectric layer over said SOG layer.

17. A method for forming a planar spin-on-glass layer on a semiconductor body in between closely spaced raised conductive members, comprising:

providing a semiconductor body having devices formed within and on its surface and with at least one closely spaced raised patterned conductive layer thereover, said patterned conductive layer comprised of closely spaced raised conductive members having spaces there between;

forming a first dielectric layer over said patterned conductive layer;

depositing a spin-on-glass (SOG) layer over said first dielectric layer and filling the space between said members of said pattern but not covering said members, by:

(a) dispensing a solution containing a solute for forming said SOG layer on said body while said body is stationary for between 0.5 and 3.5 seconds;

(b) dispensing said solute on to said body while applying said first spin cycle to said body; said first cycle having a speed in the range of about 50 to 350 rpm;

(c) applying a second spin cycle to said body; said second spin cycle having a speed greater than 3600 rpm; and (d) baking said body by:

(1) a three step bake, the first step includes baking said body at temperature in the range of about 78° to 82° C. for a time in the range of about 59 to 61 seconds in a gas ambient of nitrogen gas, the second step includes baking said body at temperature range of about 148° to 152° C. for a time in the range of about 59 to 61 seconds in a gas ambient of nitrogen gas, and the third step includes baking said body at temperature range of about 218° to 222° C. for a time in the range of about 59 to 61 seconds in a gas ambient of nitrogen gas with a nitrogen flow rate in the range between about 13 to 15 liters/min; and (2) vacuum baking said body in an atmospheric pressure in a furnace which includes baking said body at temperature range of about 240° to 260° C. for a time in the range of about 18 to 22 minutes, and in a pressure between about 2 to 4 mTorr.

(3) curing said body in an atmospheric pressure oven at a temperature in the range between about 410° to 420° C. for a time in the range between 55 and 65 minutes with a nitrogen flow rate in the range of 13 to 15 liters/min.

18. The method of claim 17 wherein said step (b) is performed for a time in the range about of 0.5 to 2.5 seconds and said step (c) is performed for a time between 19 to 21 seconds.

19. The method of in claim 17 wherein said solution is composed of a silicate; and said first spin cycle has a speed in the range of about 50 to 150 rpm for a time in the range of about 1.5 to 2.5 seconds; and said second spin cycle has a speed in the range of about 3600 to 3800 rpm for a time in the range of about 19 to 21 seconds.

20. The method of in claim 17 wherein said solution is composed of a siloxane; and said first spin cycle has a speed in the range of about 250 to 350 rpm for a time in the range of about 0.5 to 2.5 seconds; said second spin cycle has a speed in the range of about 6400 to 9600 rpm for a time in the range of about 19 to 21 seconds.

21. The method of claim 17 which further includes repeating steps (a) through (d) at least one more time to form the proper thickness of said spin-on-glass layer.

22. The method of claim 17 which further includes forming a second dielectric layer over said SOG layer.

* * * * *